US012557377B2

(12) United States Patent
Chanemougame et al.

(10) Patent No.: US 12,557,377 B2
(45) Date of Patent: Feb. 17, 2026

(54) INVERTED CROSS-COUPLE FOR TOP-TIER FET FOR MULTI-TIER GATE-ON-GATE 3DI

(71) Applicant: Tokyo Electron Limited, Tokyo (JP)

(72) Inventors: Daniel Chanemougame, Niskayuna, NY (US); Lars Liebmann, Mechanicsville, NY (US); Jeffrey Smith, Clifton Park, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 902 days.

(21) Appl. No.: 17/737,640

(22) Filed: May 5, 2022

(65) Prior Publication Data

US 2022/0367461 A1 Nov. 17, 2022

Related U.S. Application Data

(60) Provisional application No. 63/188,280, filed on May 13, 2021.

(51) Int. Cl.
*H01L 23/522* (2006.01)
*H10D 30/67* (2025.01)
(Continued)

(52) U.S. Cl.
CPC ....... *H10D 84/856* (2025.01); *H10D 30/6735* (2025.01); *H10D 30/6757* (2025.01);
(Continued)

(58) Field of Classification Search
CPC ............. H10D 84/856; H10D 30/6735; H10D 30/6757; H10D 62/118; H10D 84/0167;
(Continued)

(56) References Cited

U.S. PATENT DOCUMENTS 9,691,695 B2 6/2017 Guo et al.
9,997,598 B2 6/2018 Smith et al.
(Continued)

FOREIGN PATENT DOCUMENTS

TW 201941426 A 10/2019

OTHER PUBLICATIONS

Samuel K. Moore, "GlobalFoundries, Arm Close in on 3D Chip Integration", IEEE Spectrum, https://spectrum.ieee.org/tech-talk/semiconductors/processors/globalfoundries-arm-close-in-on-3d-chip-integration, Aug. 20, 2019, 9 pages.

(Continued)

*Primary Examiner* — Samuel Park
(74) *Attorney, Agent, or Firm* — Oblon, McClelland, Maier & Neustadt, L.L.P.

(57) ABSTRACT

Aspects of the present disclosure provide a multi-tier semiconductor structure. For example, the semiconductor structure can include a lower semiconductor device tier including lower semiconductor devices, an upper semiconductor device tier disposed over the lower semiconductor device tier and including upper semiconductor devices, a separation layer disposed between and separating the lower and upper semiconductor device tiers, a wiring tier disposed below the lower semiconductor device tier, a lower gate contact extending from a lower gate region of the lower semiconductor device tier downward to the wiring tier, an upper gate contact extending from an upper gate region of the upper semiconductor device tier downward through the separation layer to the wiring tier, and an isolator covering a lateral surface of the upper gate contact and electrically isolating the upper and lower gate contacts. The lower gate contact and the upper gate contact can be independent from each other.

9 Claims, 14 Drawing Sheets

(51) Int. Cl.
  *H10D 62/10* (2025.01)
  *H10D 84/01* (2025.01)
  *H10D 84/03* (2025.01)
  *H10D 84/85* (2025.01)

(52) U.S. Cl.
  CPC ....... *H10D 62/118* (2025.01); *H10D 84/0167* (2025.01); *H10D 84/0186* (2025.01); *H10D 84/038* (2025.01)

(58) Field of Classification Search
  CPC ............. H10D 84/0186; H10D 84/038; H10D 30/014; H10D 30/43; H10D 64/517; H10D 62/121; H10D 88/00; H10D 84/85; H10D 88/01; B82Y 10/00; H01L 23/528
  See application file for complete search history.

(56) References Cited

U.S. PATENT DOCUMENTS

| | | | |
|---|---|---|---|
| 10,170,404 B2 | 1/2019 | Guo et al. | |
| 10,453,850 B2 | 10/2019 | Smith et al. | |
| 10,529,830 B2 | 1/2020 | Tapily et al. | |
| 10,573,655 B2 | 2/2020 | Smith et al. | |
| 10,763,198 B2 | 9/2020 | Guo et al. | |
| 10,770,479 B2 | 9/2020 | Smith et al. | |
| 10,930,764 B2 | 2/2021 | Tapily et al. | |
| 10,964,706 B2 | 3/2021 | Smith et al. | |
| 11,201,148 B2 | 12/2021 | Liebmann et al. | |
| 11,282,861 B2 | 3/2022 | Nelson et al. | |
| 2017/0062319 A1 | 3/2017 | Guo et al. | |
| 2017/0287826 A1 | 10/2017 | Guo et al. | |
| 2018/0026042 A1 | 1/2018 | Smith et al. | |
| 2018/0040695 A1 | 2/2018 | Smith et al. | |
| 2018/0047832 A1 | 2/2018 | Tapily et al. | |
| 2018/0240802 A1 | 8/2018 | Smith et al. | |
| 2019/0131230 A1 | 5/2019 | Guo et al. | |
| 2019/0172828 A1 | 6/2019 | Smith et al. | |
| 2019/0288004 A1 | 9/2019 | Smith et al. | |
| 2019/0326301 A1 | 10/2019 | Smith et al. | |
| 2019/0355756 A1 | 11/2019 | Nelson et al. | |
| 2020/0075574 A1* | 3/2020 | Smith | B82Y 10/00 |
| 2020/0098897 A1 | 3/2020 | Tapily et al. | |
| 2020/0126987 A1 | 4/2020 | Rubin et al. | |
| 2020/0135718 A1 | 4/2020 | Reference | |
| 2020/0294998 A1* | 9/2020 | Lilak | H01L 23/535 |
| 2020/0402899 A1 | 12/2020 | Guo et al. | |

OTHER PUBLICATIONS

International Search Report and Written Opinion issued Aug. 26, 2022 in PCT/US2022/028301, 9 pages.
Combined Taiwanese Office Action and Search Report issued Jul. 17, 2025 in Taiwanese Patent Application No. 111117437, 13 pages.
Korean Office Action dated Oct. 31. 2025, in Korean Patent Application No. 10-2023-7042196, w/English translation, 7 pages.
Taiwanese Office Action dated Nov. 26, 2025, in Chinese Patent Application No. 111117437, w/English translation, 10 pages.

* cited by examiner

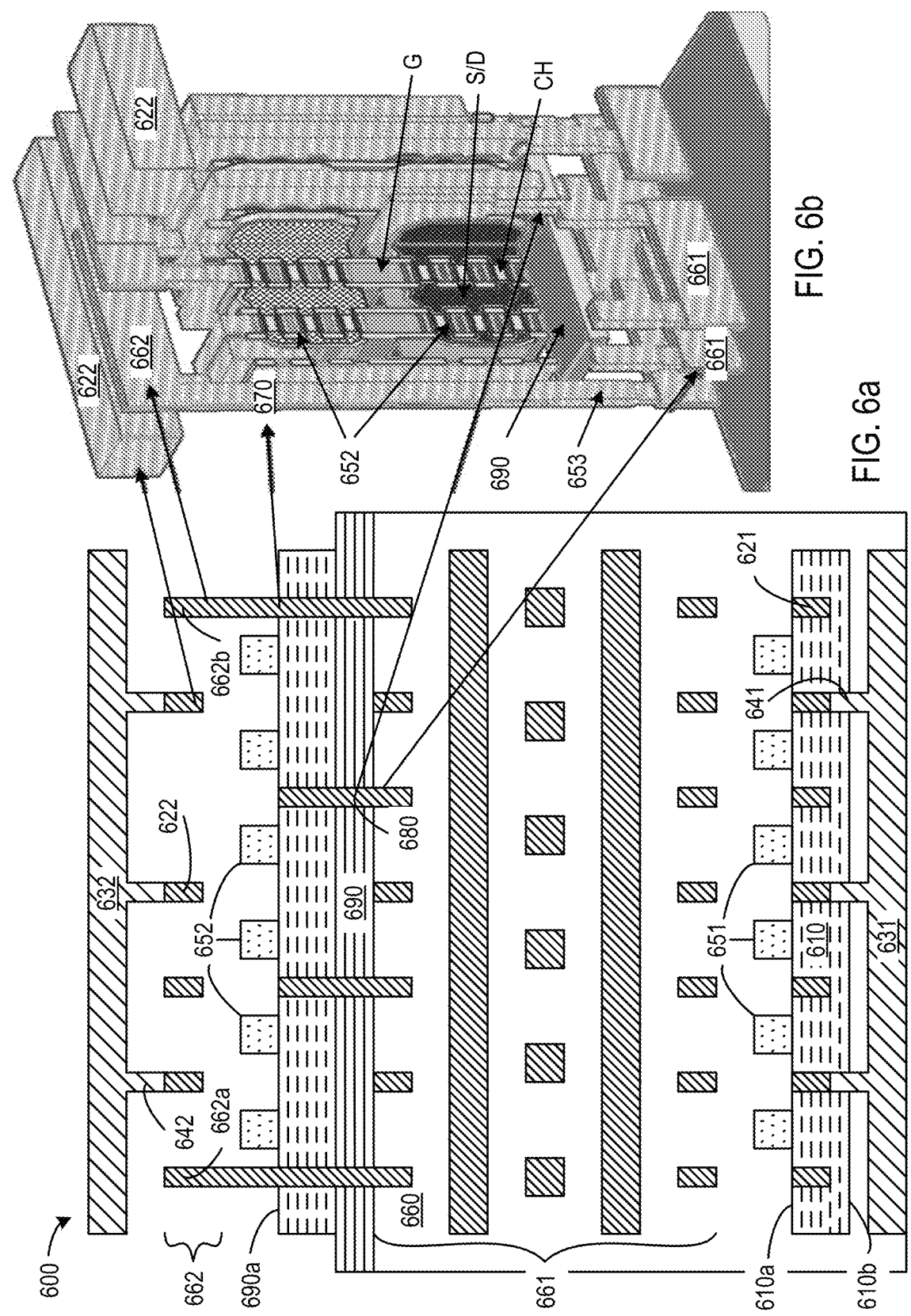

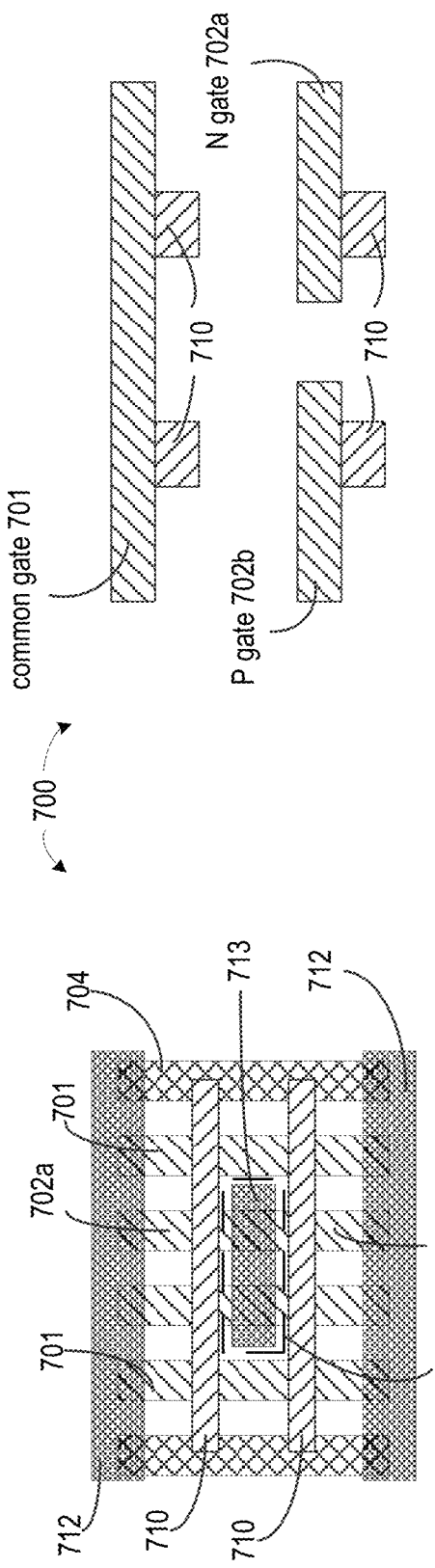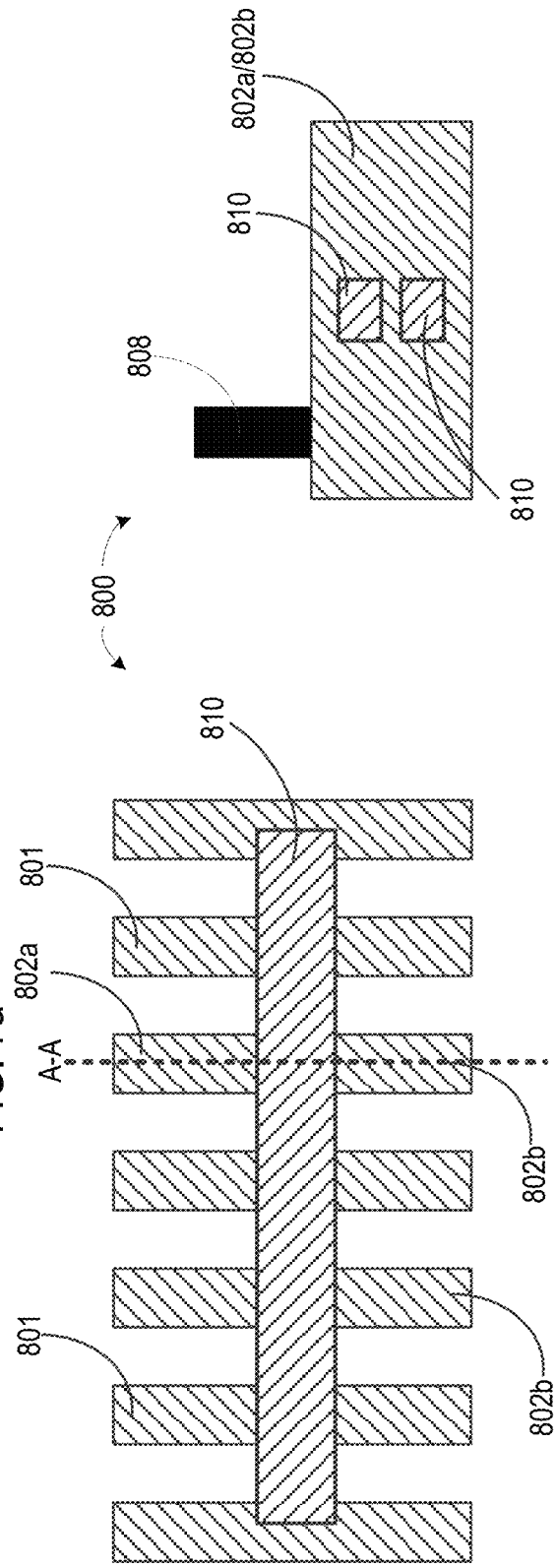
FIG. 7a
FIG. 7b
FIG. 8a
FIG. 8b

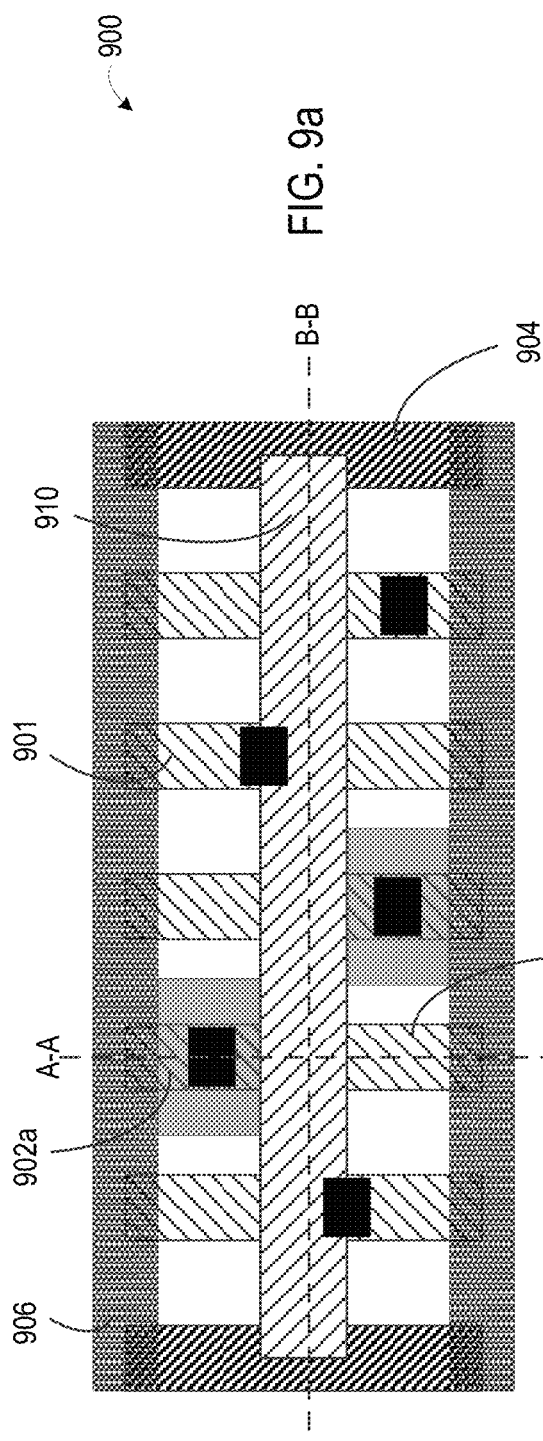
FIG. 9a
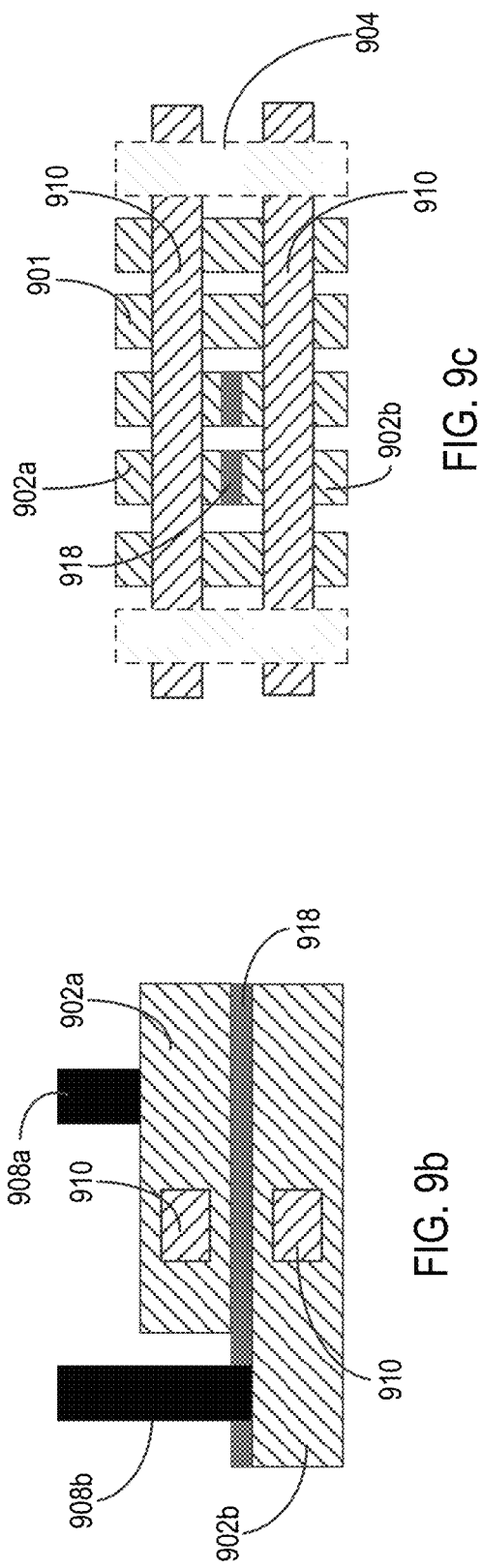
FIG. 9c
FIG. 9b

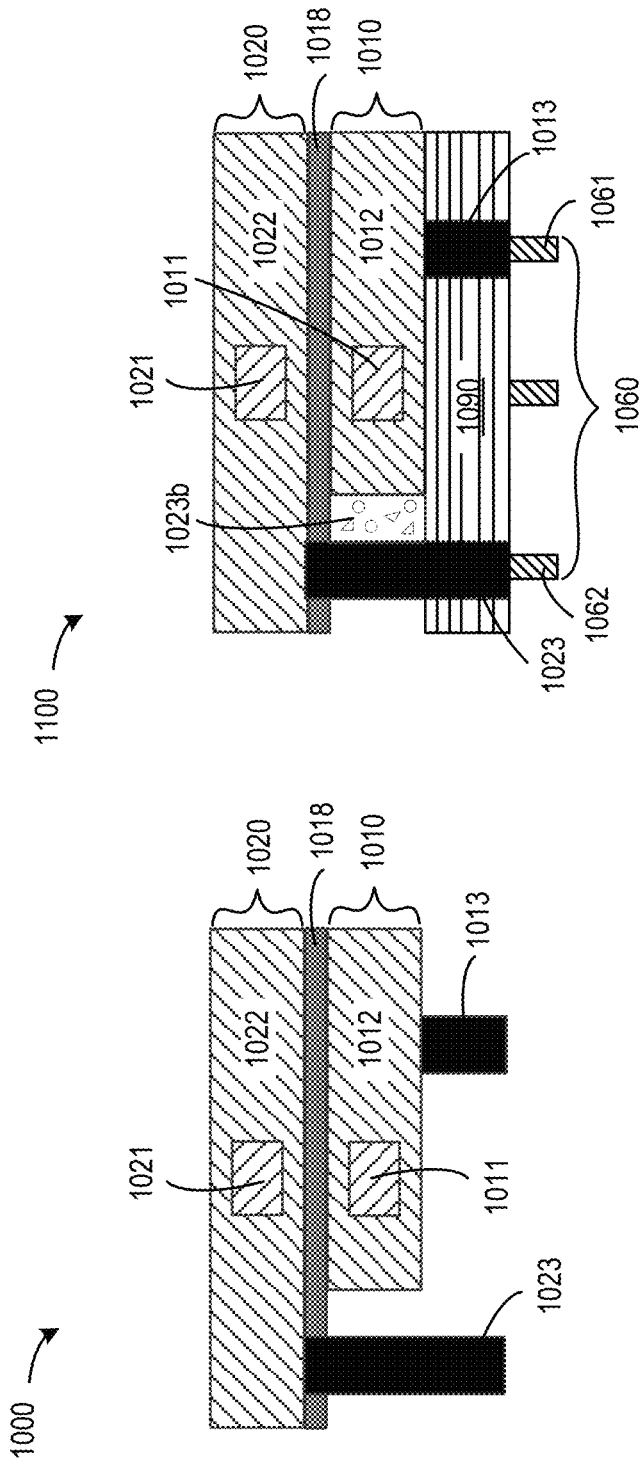

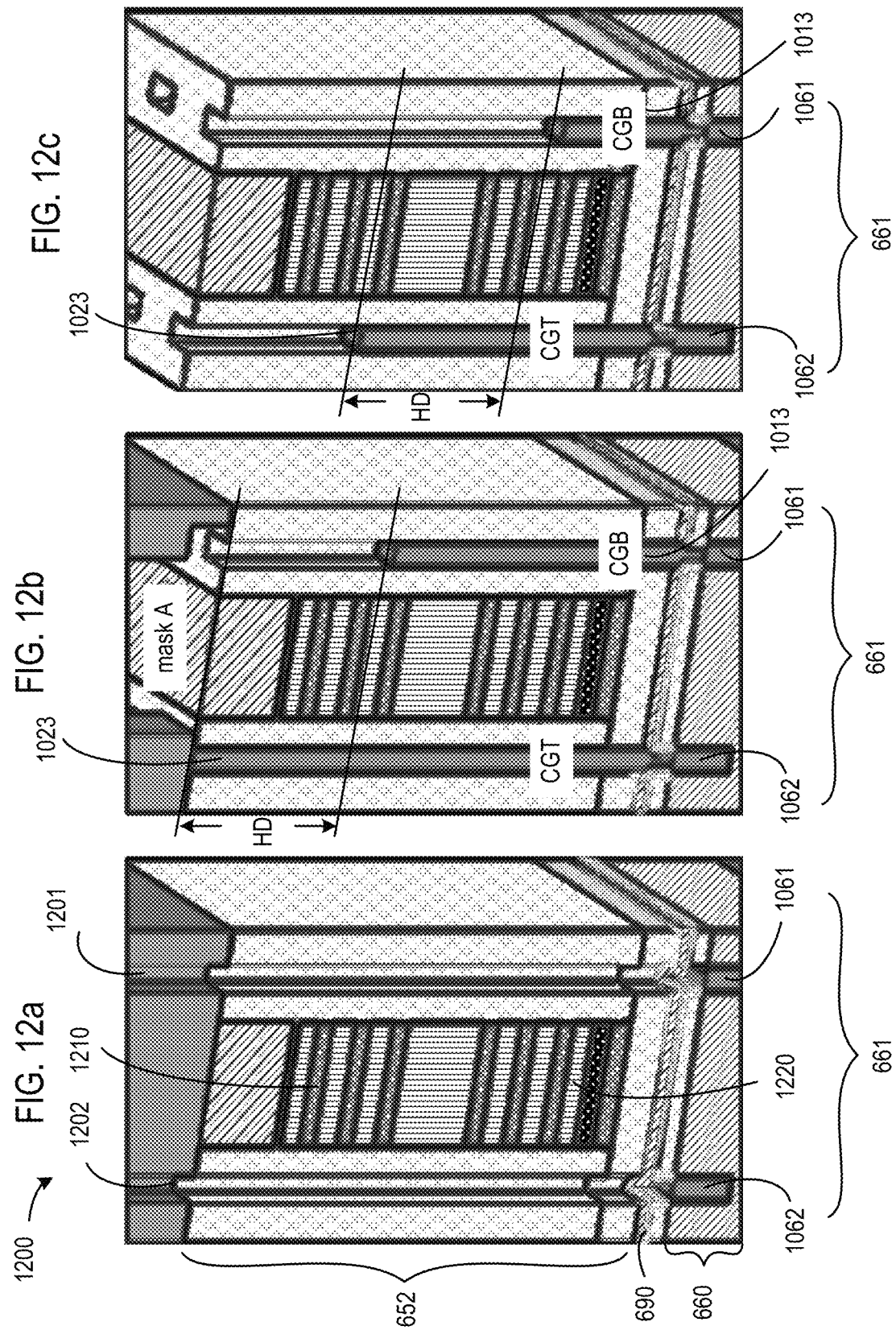

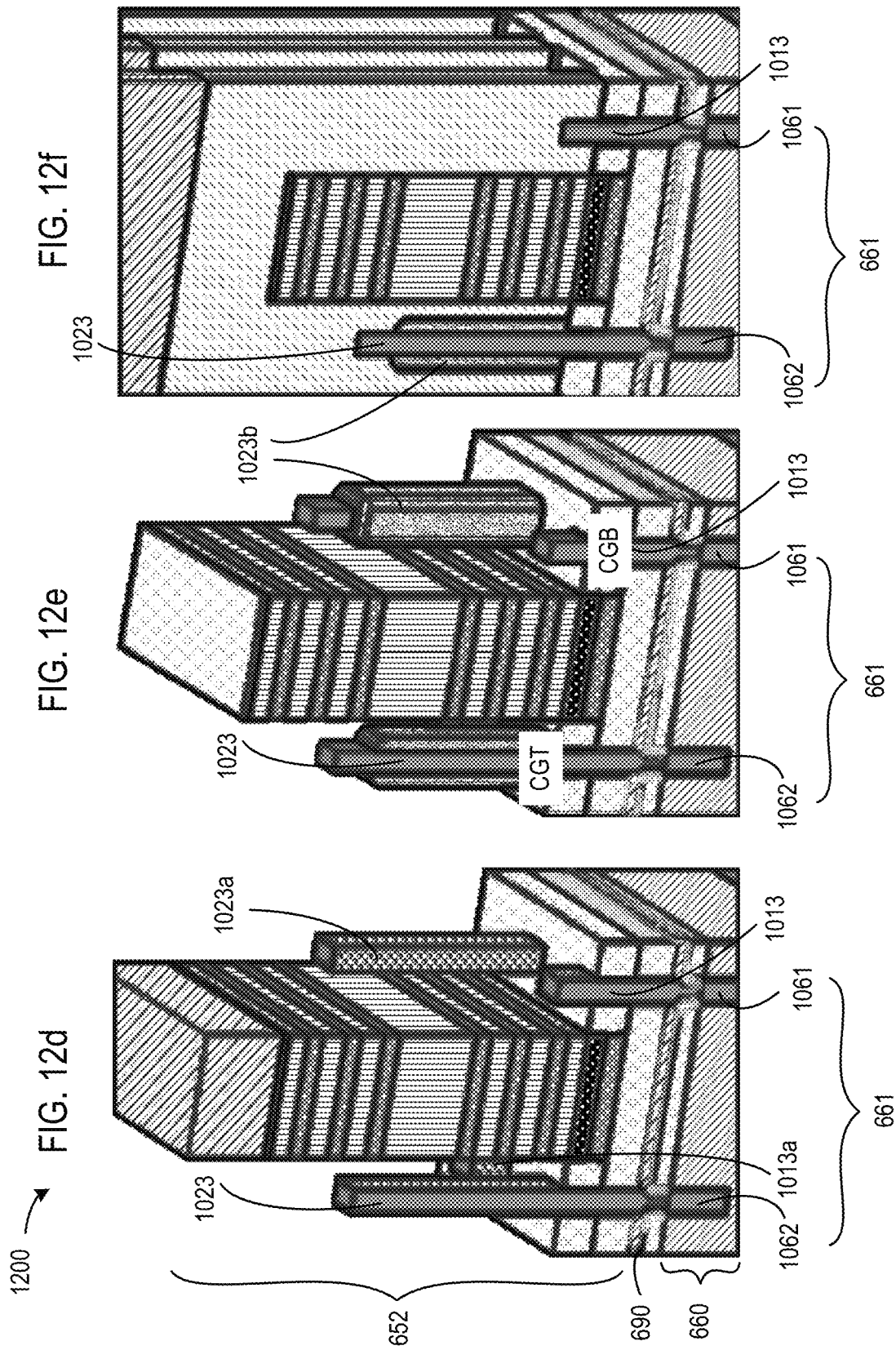

INVERTED CROSS-COUPLE FOR TOP-TIER FET FOR MULTI-TIER GATE-ON-GATE 3DI

INCORPORATION BY REFERENCE

This present disclosure claims the benefit of U.S. Provisional Application No. 63/188,280, entitled "Inverted Cross-Couple for Top-Tier FET for Multi-Tier Gate-on-Gate 3Di" filed on May 13, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method of fabricating a multi-tier semiconductor structure. For example, the method can include forming a wiring tier, and forming a lower semiconductor device tier over the wiring tier, the lower semiconductor device tier including lower semiconductor devices. The method can also include forming a separation layer over the lower semiconductor device tier, and forming an upper semiconductor device tier over the separation layer, the upper semiconductor device tier being separated from the lower semiconductor device tier by the separation layer and including upper semiconductor devices. The method can also include forming a lower gate contact that extends from a lower gate region of the lower semiconductor device tier downward to the wiring tier, forming an upper gate contact that extends from an upper gate region of the upper semiconductor device tier downward through the separation layer to the wiring tier, and forming an isolator to cover a lateral surface of the upper gate contact to electrically isolate the upper gate contact from the lower gate region. In an embodiment, the lower gate contact and the upper gate contact can be independent from each other.

In an embodiment, the wiring tier can include a lower wiring track, to which the lower gate contact extends downward, and an upper wiring track, to which the upper gate contact extends downward. The lower wiring track and the upper wiring track can be independent from each other.

In an embodiment, the lower gate contact and the upper gate contact can be formed by forming a lower gate contact opening and an upper gate contact opening through the upper semiconductor device tier and the lower semiconductor device tier to uncover the wiring tier, filling the lower gate contact opening and the upper gate contact opening with metal, and recessing the metal such that a top of the metal filled in the lower gate contact opening is at a level within the lower gate region and a top of the metal filled in the upper gate contact opening is at a level within the upper gate region. In another embodiment, the top of the metal filled in the upper gate contact opening and the top of the metal filled in the upper gate contact opening can have a height differential, and recessing the metal can include recessing the metal filled in the upper gate contact opening the height differential, and recessing the metal filled in the upper gate contact opening and the metal filled in the lower gate contact opening at a same rate until the top of the metal filled in the upper gate contact opening is at the level within the upper gate region or the top of the metal filled in the lower gate contact opening is at the level within the lower gate region. In some other embodiments, the isolator can be formed by removing a surrounding portion of the upper semiconductor device tier and the lower semiconductor device tier to uncover the upper gate contact and the lower gate contact, and covering the lateral surface of the upper gate contact with the isolator. In various embodiments, the method can further include forming a lower liner on a lateral surface of the lower gate contact opening and an upper liner on a lateral surface of the upper gate contact opening, wherein recessing the metal includes recessing the metal and the lower and upper liners. For example, the isolator can include a dielectric layer. As another example, the isolator can include a dielectric block.

In an embodiment, the lower semiconductor devices can be vertically stacked on one another, and the upper semiconductor devices can be vertically stacked on one another. In another embodiment, the vertically stacked lower semiconductor devices can include lower gate-all-around (GAA) semiconductor devices with lower nanosheet channels, and the vertically stacked upper semiconductor devices can include upper GAA semiconductor devices with upper nanosheet channels. In some other embodiments, the lower GAA semiconductor devices can include p-type field effect transistors (FETs) or n-type FETs, and the upper GAA semiconductor devices can include p-type FETs or n-type FETs.

In an embodiment, the method can further include forming an insulator layer on the wiring tier, wherein forming a lower semiconductor device tier over the wiring tier can include forming a lower semiconductor device tier on the insulator layer, forming a lower gate contact can include forming a lower gate contact that extends from a lower gate region of the lower semiconductor device tier downward through the insulator layer to the wiring tier, and forming upper gate contact can include forming an upper gate contact that extends from an upper gate region of the upper semiconductor device tier downward through the separation layer and the insulator layer to the wiring tier.

Aspects of the present disclosure also provide a multi-tier semiconductor structure. For example, the multi-tier semiconductor structure can include a lower semiconductor device tier that includes lower semiconductor devices and an upper semiconductor device tier disposed over the lower semiconductor device tier, the upper semiconductor device tier including upper semiconductor devices. The multi-tier semiconductor structure can also include a separation layer disposed between and separating the lower semiconductor device tier and the upper semiconductor device tier, a wiring tier disposed below the lower semiconductor device tier, a lower gate contact extending from a lower gate region of the lower semiconductor device tier downward to the wiring tier, an upper gate contact extending from an upper gate region of the upper semiconductor device tier downward through the separation layer to the wiring tier, and an isolator formed to cover a lateral surface of the upper gate contact, the isolator electrically isolating the upper gate contact from the lower gate region. In an embodiment, the lower gate contact and the upper gate contact can be independent from each other.

In an embodiment, the wiring tier can include a lower wiring track, to which the lower gate contact extends downward, and an upper wiring track, to which the upper gate contact extends downward, wherein the lower wiring track and the upper wiring track are independent from each other.

In an embodiment, the lower semiconductor devices can be vertically stacked on one another, and the upper semiconductor devices are vertically stacked on one another. In another embodiment, the vertically stacked lower semiconductor devices can include lower GAA semiconductor devices with lower nanosheet channels, and the vertically stacked upper semiconductor devices can include upper GAA semiconductor devices with upper nanosheet channels. In some other embodiments, the lower GAA semiconductor devices can include p-type FETs or n-type FETs, and the upper GAA semiconductor devices can include p-type FETs or n-type FETs.

In an embodiment, the multi-tier semiconductor structure can also include an insulator layer disposed between the lower semiconductor device tier and the wiring tier, wherein the lower gate contact and the upper gate contact extend downward to the wiring tier through the insulator layer. For example, the isolator can include a dielectric layer. As another embodiment, the isolator can include a dielectric block.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIG. 6a shows a cross-sectional view of an exemplary multi-tier semiconductor structure of FIG. 6b in accordance with some embodiments of the present disclosure;

FIG. 6b shows a perspective view of the semiconductor structure in accordance with some embodiments of the present disclosure;

FIG. 7a illustrates a conventional, side by side, CMOS logic cell layout with shared, common N and P gates and with independent N and P gates;

FIG. 7b illustrates a cross section of the CMOS logic cell of FIG. 7a;

FIG. 8a illustrates a CFET CMOS logic cell with shared, common N and P gates, and with independent N and P gates;

FIG. 8b illustrates a cross section of the CFET CMOS logic cell of FIG. 8a;

FIG. 9a illustrates a "birds-eye-view" layout for a CFET CMOS logic cell in which both common and independent N & P gates are required in accordance with some embodiments of the present disclosure;

FIG. 9b illustrates a cross-sectional view along line A-A of the CFET CMOS logic cell of FIG. 9a;

FIG. 9c illustrates a cross-sectional view along line B-B of the CFET CMOS logic cell of FIG. 9a;

FIG. 10 shows a cross-sectional view of an example multi-tier semiconductor structure in accordance with some embodiments of the present disclosure;

FIG. 11 shows a cross-sectional view of another example multi-tier semiconductor structure in accordance with some embodiments of the present disclosure;

FIGS. 12a to 12g illustrate an example method of fabricating a multi-tier semiconductor structure according to some embodiments of the present disclosure.

DETAILED DESCRIPTION

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

Techniques herein include an inverted cross-couple for top-tier FET for multi-tier gate-on-gate three-dimensional integration. Techniques herein include independent lower and upper gates, which provides significant design and area scaling advantages. These techniques enable such a design feature in the challenging context of an inverted top-tier FET for multi-tier gate-on-gate 3D integration. In particular, each independent gate is connected to a metal layer located below the active devices thanks to the formation of gate contacts achieved by the techniques herein. As such, CFET designs can be enhanced significantly.

This disclosure relates to dense 3D integration (3Di), in particular, to gate-on-gate (GoG) 3Di, more specifically to GoG 3Di implemented in sequential (aka monolithic) 3Di with dense nm-scale connectivity (as distinguished from micron-scale connectivity achievable with face-to-face bonding). Embodiments herein also are applicable to an inverted transistor architecture configured to exploit the dense connectivity in sequential 3Di. This is beneficial because the semiconductor industry is moving to 3Di and terminology is becoming more conventional.

Figure 1:
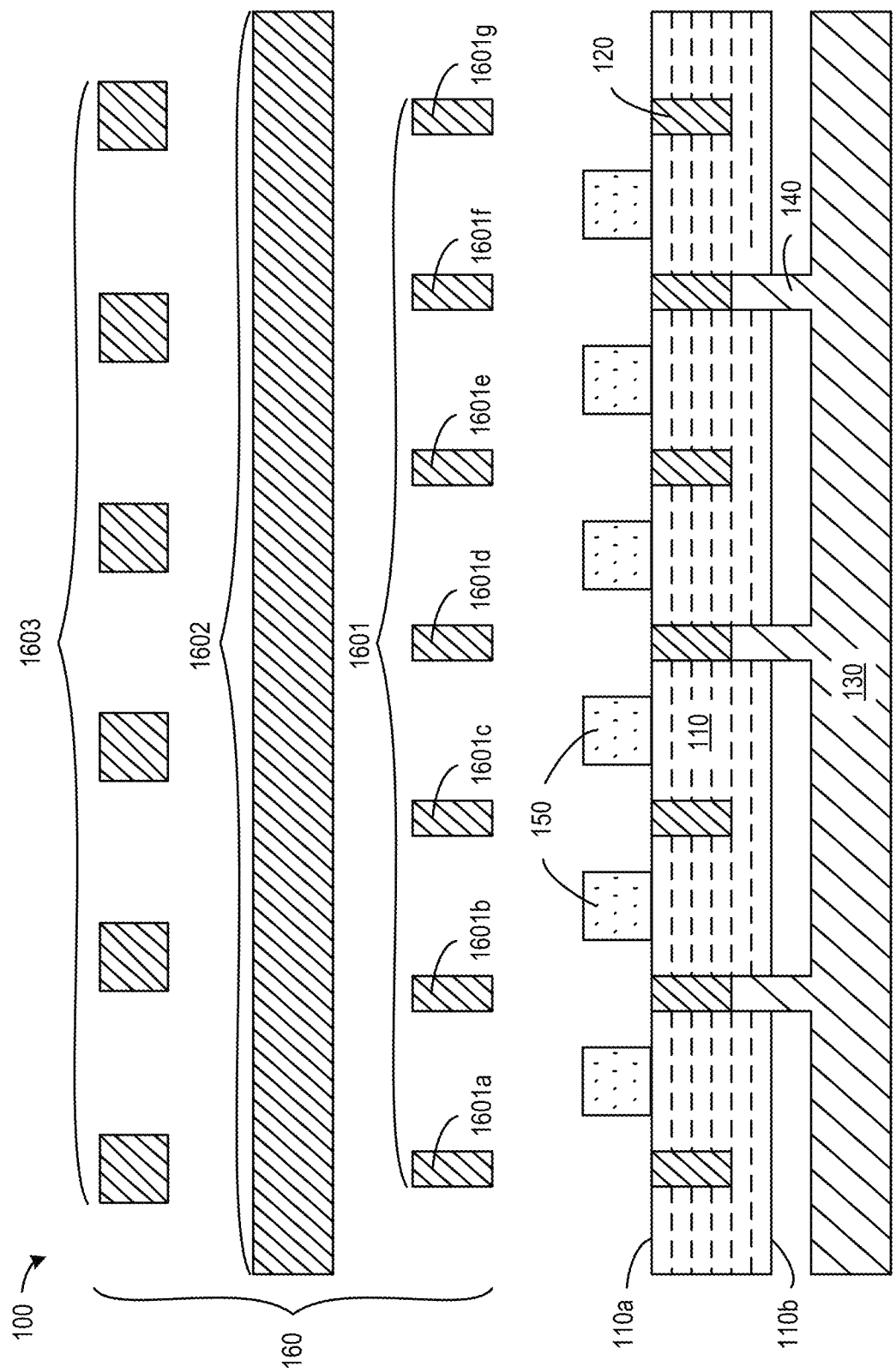
FIG. 1 shows a simplified cross-sectional view of a semiconductor segment.

FIG. 1 shows a simplified cross-sectional view of a semiconductor segment 100. A substrate (or a wafer) 110, e.g., a silicon or SiGe substrate, can be provided. A semiconductor device tier 150 can be disposed on a front side 110a of the substrate 110. For example, the semiconductor device tier 150 can include one or more semiconductor devices, such as field effect transistors (FETs), that form a functional circuit, such as a logic circuit or a memory circuit. Further, these FETs can be n-type or p-type FETs that are arranged along the front side 110a or stacked vertically over one another along the thickness direction of the substrate 110.

One or more power rails 120 can be buried in the substrate 110 and electrically connect the semiconductor device tier 150 to a power delivery network (PDN) 130 by way of TSVs (e.g., nano-scale) 140 to provide low voltage (Vss) and high voltage (VDD) power delivery, for example, from the PDN 130 to the semiconductor device tier 150. The PDN 130 can be formed on a back side 110b of the substrate 110.

A wiring tier 160 can be disposed over the semiconductor device tier 150 and used to electrically connect the semiconductor device tier 150 to, for example, another semiconductor device tier (not shown) disposed over the wiring tier 160. The wiring tier 160 can include one or more wiring layers (or wiring levels), with each wiring layer including one or more wiring tracks that extend in a direction along the front side 110a of the substrate 110. Generally, wiring tracks in one wiring layer will run in a direction perpendicular to the direction of wiring tracks in an adjacent wiring layer. For example, the wiring tier 160 can include three wiring layers 1601, 1602 and 1603, and the wiring layer 1601 can include seven wiring tracks 1601a to 1601g that extend in a direction (e.g., perpendicular to the plane of the drawing page) perpendicular to the direction of wiring tracks in the wiring layer 1602 along the front side 110a of the substrate 110.

Figure 2:
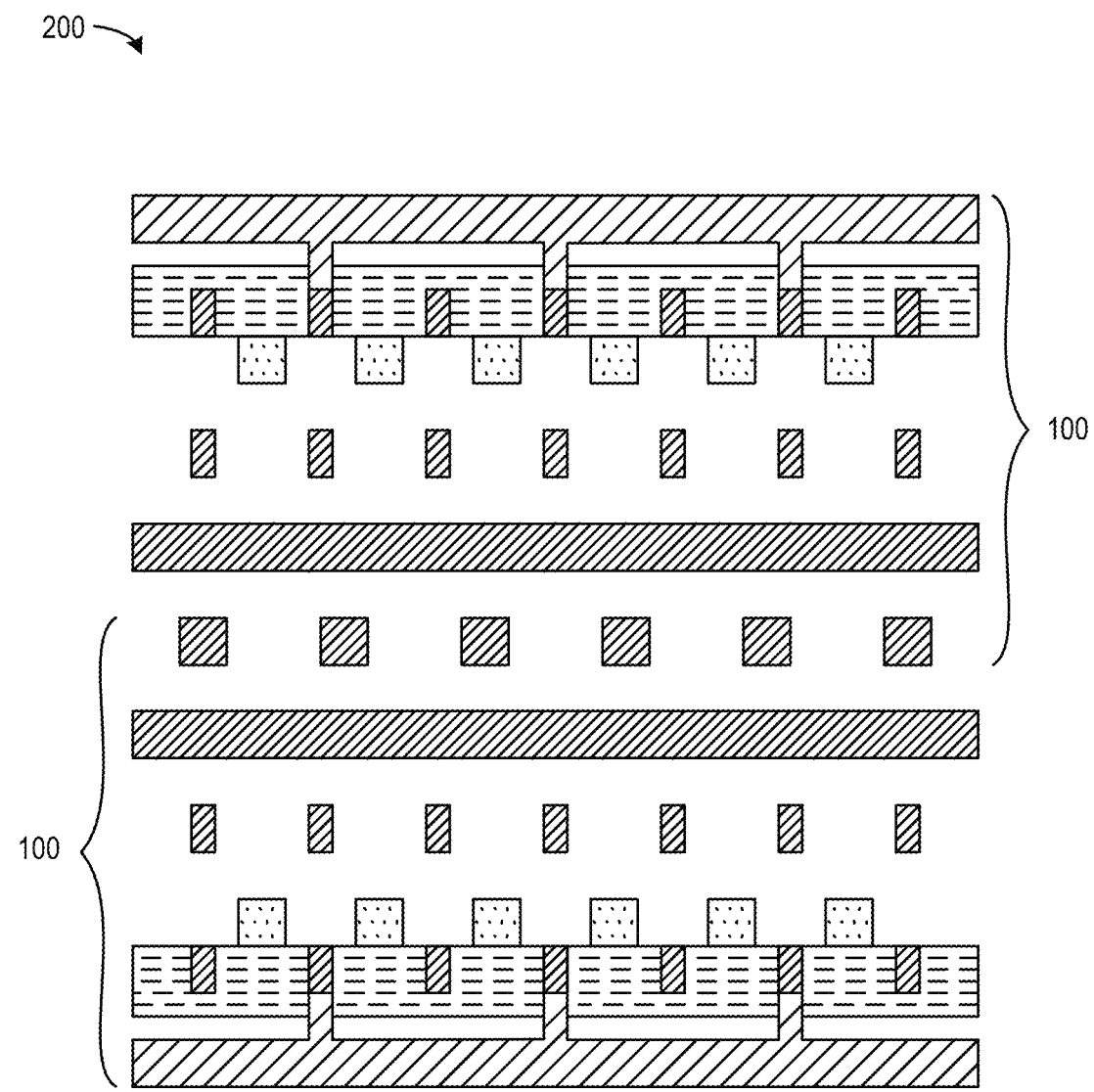
FIG. 2 shows a semiconductor structure that includes two semiconductor segments fabricated in face-to-face 3D integration (3Di)

FIG. 2 shows a semiconductor structure 200 that includes two semiconductor segments fabricated in face-to-face 3D integration (3Di), that is, a multi-tier stack of semiconductor devices with a high-density of inter-tier wiring for efficient logic-to-memory or logic-to-logic connections. These two semiconductor segments can be built separately, and each semiconductor segment can include power distribution, semiconductor devices (such as FETs) and a wiring tier. For example, the semiconductor structure 200 can include two of the semiconductor segments 100 shown in FIG. 1 that are vertically stacked over each other by flipping one upside down (i.e., being inverted), and each of the semiconductor segments 100 can include the power distribution (e.g., the power rails 120, the PDN 130 and the TSVs 140), the semiconductor devices (e.g., the semiconductor device tier 150), and the wiring tier (e.g., the wiring tier 160). In the face-to-face 3Di fabrication, these two separately built semiconductor segments 100 are carefully aligned to each other and bonded together face-to-face at bonding sites (not shown) by face-to-face bonds. Generally, one of the semiconductor segments 100 can include TSVs that lead to bumps (not shown) disposed on the top of the semiconductor segment 100, which are used to connect the semiconductor structure 200 to its package, as described in detailed at https://spectrum.ieee.org/tech-talk/semiconductors/processors/globalfoundries-arm-close-in-on-3d-chip-integration.

Figure 3:
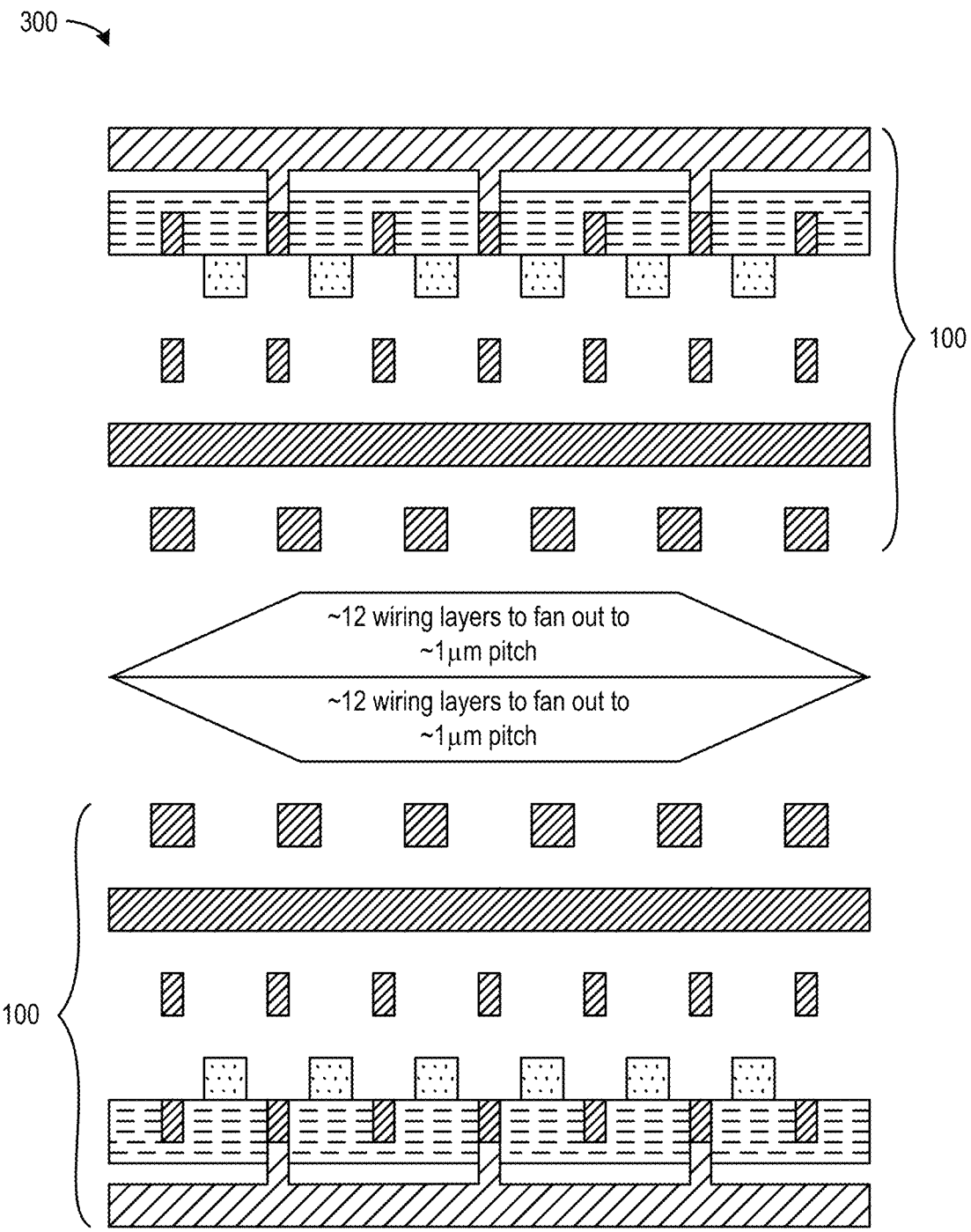
FIG. 3 shows a semiconductor structure that includes two semiconductor segments fabricated in face-to-face 3Di.

FIG. 3 shows a semiconductor structure 300 that includes two semiconductor segments fabricated in face-to-face 3Di. It can be seen that the face-to-face bonding can require a relatively tall (or thick) wire stack (i.e., a large number of wiring layers) to gradually expand the wiring pitch to the large values required to meet the overlay requirements of face-to-face bonding (e.g., 12 wiring layers to fan out to 1 μm pitch). In the process, this gradual expansion leads to a significant increase of area used that defeats the initial purpose of density gains sought after by face-to-face 3Di. Therefore, this face-to-face 3Di approach is not a true monolithic integration because independently processed wafers or wafer segments are stacked on top of each other, and cannot offer a true scaling solution for semiconductor fabrication.

To achieve overlay tolerances compatible with dense inter-tier wiring, sequential 3Di (also referred to by some as monolithic 3Di) is needed.

Figure 4:
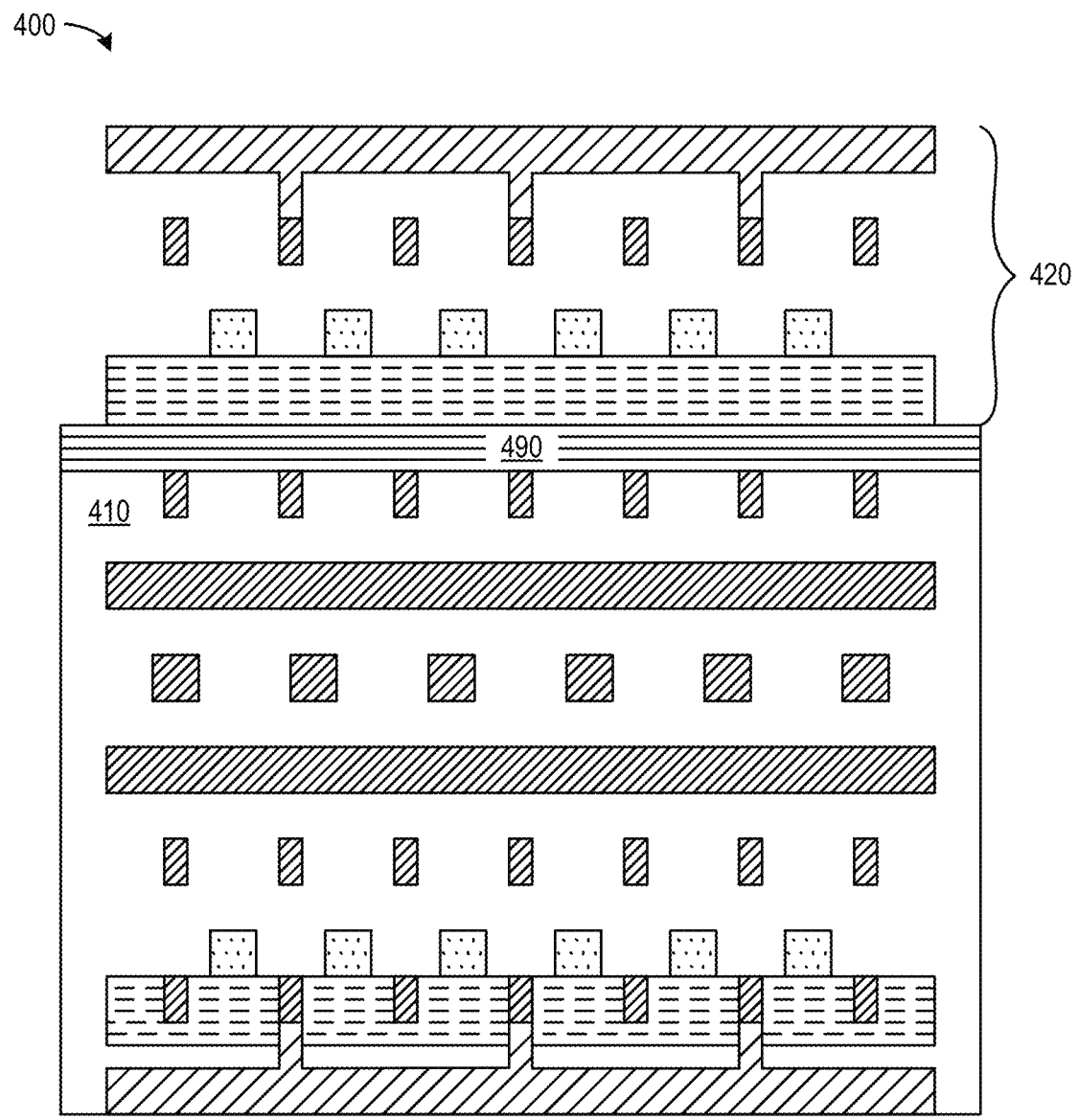
FIG. 4 shows a semiconductor structure that includes two semiconductor segments fabricated in a sequential 3Di process.

FIG. 4 shows a semiconductor structure 400 that includes two semiconductor segments fabricated in a sequential 3Di process. In the sequential 3Di process, a complete bottom tier 410 (which can be similar to the semiconductor segment 100) can be built in the beginning, then a silicon on insulator (SoI) layer 490 can be bonded to the top of the bottom tier 410, and finally a top tier 420, which can also include power distribution, semiconductor devices (such as FETs) and a wiring tier, can be built over the SoI layer 490. A major advantage of this sequential 3Di process is the near perfect alignment of the top tier 420 to the existing bottom tier 410. This can be achieved by lithographic alignment through the thinned SoI layer 490.

Figure 5:
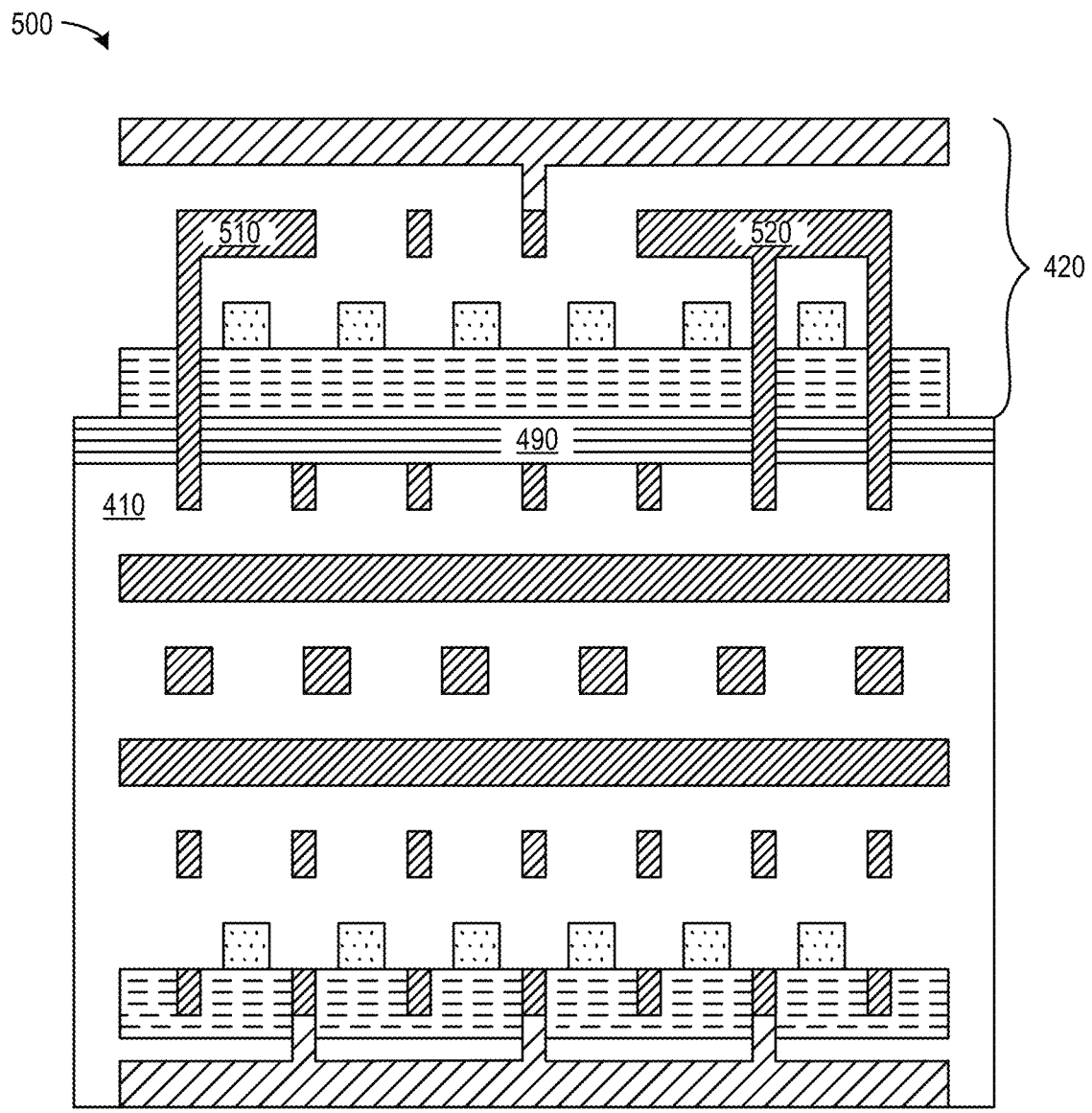
FIG. 5 shows a semiconductor structure that includes two semiconductor segments fabricated in a sequential 3Di process.

FIG. 5 shows a semiconductor structure 500 that includes two semiconductor segments fabricated in a sequential 3Di process, e.g., the bottom tier 410 and the top tier 420 shown in FIG. 4. As shown, a challenge in the sequential 3Di process is connection, e.g., 510 and 520, between the top tier 420 and the bottom tier 410. For example, running top-tier signals laterally to inter-tier vias can result in blocking space and reducing achievable device density on the top tier 420. Thus, connectivity density directly competes with the device density of the top tier 420.

FIG. 6a shows a cross-sectional view of an exemplary multi-tier semiconductor structure 600, and FIG. 6b is a perspective view representing only the top tier of the semiconductor structure 600, in accordance with some embodiments of the present disclosure. In an embodiment, the semiconductor structure 600, in a bottom tier 660, can include a substrate 610 (or a wafer) (not visible on FIG. 6b). For example, the substrate 610 can be a silicon or SiGe substrate. A first semiconductor device tier 651 can be disposed on a front side 610a of the substrate 610. For example, the first semiconductor device tier 651 can include one or more semiconductor devices, such as field effect transistors (FETs), that form a functional circuit, such as a logic circuit or a memory circuit. Further, these FETs can be n-type or p-type FETs (e.g., NMOSs and PMOSs) that are arranged along the front side 610a or stacked vertically over one another along the thickness direction of the substrate 610.

One or more first power rails 621 can be buried in the substrate 610 and electrically connect the first semiconductor device tier 651 to a first PDN 631 by way of first TSVs (e.g., nano-scale) 641 to provide low voltage (Vss) and high voltage (VDD) power delivery, for example, from the first PDN 631 to the first semiconductor device tier 651. The first PDN 631 can be formed on a back side 610b of the substrate 610.

A first wiring tier 661 can be disposed over the first semiconductor device tier 651 and used to electrically connect the first semiconductor device tier 651 to, for example, another semiconductor device tier (e.g., a second semiconductor device tier 652) disposed over the first wiring tier 661 or another wiring tier (e.g., a second wiring tier 662). Similar to the wiring tier 160 shown in FIG. 1, the first wiring tier 661 can also include one or more wiring layers (or wiring levels), with each wiring layer including one or more wiring tracks that extend in a direction along the front side 610a of the substrate 610. For example, the first wiring tier 661 can include five wiring layers, and the upmost, middle and bottommost ones can include seven, six and seven wiring tracks, respectively. Generally, wiring tracks in one wiring layer will run in a direction perpendicular to the direction of wiring tracks in an adjacent wiring layer. For example, the wiring tracks in the topmost wiring layer can extend in a direction (e.g., perpendicular to the plane of the drawing page) perpendicular to the direction of wiring tracks in a wiring layer right below the topmost wiring layer along the front side 610a of the substrate 610.

An insulator layer (or an SoI layer) 690 (indicated by the arrow but not shown in FIG. 6b for simplicity) can be formed over and bonded to the top of the first wiring tier 661. For example, the insulator layer 690 can include a thermal silicon oxide (SiO$_2$) layer.

The second semiconductor device tier 652 can be deposited and formed over a front side 690a of the insulator layer (or the SoI layer) 690. For example, the second semiconductor device tier 652 can include one or more semiconductor devices, such as FETs, that form a functional circuit, such as a logic circuit or a memory circuit. Further, these FETs can be n-type or p-type FETs that are arranged along the front side 690a of the insulator layer 690 or stacked vertically over one another along the thickness direction of the insulator layer 690. For example, these FETs can form a standard cell, e.g., an XOR or NAND logic cell, and include multiple lower p-type FETs and multiple upper n-type FETs stacked vertically over the lower p-type FETs to form complementary FETs (CFETs). Neighboring CFETs can be isolated by a diffusion break region 653 (indicated by the arrow but not shown for simplicity), which can provide a space which monolithic inter-tier vias (MIVs) 670 (described later) can go through. For example, the diffusion break region 653 can include double diffusion break (DDB) or single diffusion break (SDB). As another example, these FETs can be GAA or GAA nano-sheet (GAA NS) FETs, with nanosheet channels, that have source/drain regions S/D, gate regions G, and channel (or nano-channel) regions CH that are all surrounded by the gate regions G. Note that description herein focused on CFET and GAA devices for convenience, but it can be appreciated that techniques herein can be applied to other 3D device architectures.

The second wiring tier 662 can be disposed over the second semiconductor device tier 652 and used to electrically connect the second semiconductor device tier 652 to, for example, another semiconductor device tier (e.g., the first semiconductor device tier 651) and another wiring tier (e.g., the first wiring tier 661). Similar to the wiring tier 160 shown in FIG. 1, the second wiring tier 662 can include one or more wiring layers (or wiring levels), with each wiring layer including one or more wiring tracks that extend in a direction along the front side 690a of the insulator layer 690. For example, the second wiring tier 662 can include one wiring layer, and the wiring layer can include two wiring tracks 662a and 662b.

One or more second power rails 622 can be formed over the second semiconductor device tier 652 and electrically connect the second semiconductor device tier 652 to a second PDN 632 by way of second TSVs (e.g., nano-scale) 642 to provide low voltage (Vss) and high voltage (VDD) power delivery, for example, from the second PDN 632 to the second semiconductor device tier 652. Accordingly, the second semiconductor device tier 652 can include inverted top-tier FETs of the exemplary multi-tier semiconductor structure 600.

One or more monolithic inter-tier vias (MIVs) 670 can be formed to electrically connect the second wiring tier 662 to the first wiring tier 661. For example, the MIVs 670 can be aligned with a dummy poly and formed vertically through the diffusion break region 653 and the insulator layer 690 to electrically connect the second wiring tier 662 to the first wiring tier 661, without running top-tier signals laterally to inter-tier vias.

Further, one or more connections can be formed to electrically connect the second semiconductor device tier 652 to the first wiring tier 661. For example, the connections can include one or more gate contacts 680 that are formed vertically through the insulator layer 690 to electrically connect the gate regions G of the lower FETs of the second semiconductor device tier 652 to the outside (e.g., the first wiring tier 661).

FIGS. 6a and 6b and corresponding description thereof are disclosed in U.S. Ser. No. 63/151,166 entitled "Inverted top-tier FET for multi-tier gate-on-gate 3Di," which is incorporated herein by reference in its entirety.

Techniques herein include enabling a design aspect of standard cells, in the context of the inverted top-tier FET disclosure for multi-tier gate on gate. As previously disclosed in U.S. Ser. No. 16/848,638 entitled "Apparatus And Method For Simultaneous Formation Of Diffusion Break, Gate Cut, And Independent N And P Gates For 3d Transistor Devices," which is incorporated herein by reference in its entirety, to obtain CMOS logic with a conventional integration scheme for conventional 2D designs, N and P transistors are placed side by side, and share a common gate to achieve the CMOS complementary function. While this is the majority, there are some critical logic cells that require the N and P gates to be independent from each other.

FIGS. 7a and 7b show a conventional CMOS logic cell 700 with shared, common N/P gates 701, and with independent N/P gates 702a/702b. The CMOS logic cell 700 further includes dummy gates 704, lateral cuts 712, a poly cut 713, and active layers 710. This functionality enables significant design scaling capability, and is therefore critical for advanced technology logic designs. With such 2D designs, it is straightforward to separate the independent N/P gates 702a/702b. The poly cut 713 is used to disconnect the N/P gates 702a/702b where needed, typically in the middle of the CMOS logic cell 700, in an N/P separation space 714.

In a CFET device, providing this functionality is more complex because the n-type and p-type semiconductor devices, and their gates, are on top of each other, instead of arranged side by side. The N/P separation space 714 must now be made in the vertical plane instead of the horizontal plane, and the lower and upper gates need to be contacted independently from the top by the local interconnects.

FIG. 8a is a diagram of a CFET CMOS logic cell 800 with shared, common N/P gates 801, and with independent N/P gates 802a/802b. FIG. 8b shows a cross section along A-A illustrating the inherent difficulty to achieve this in a CFET. As discovered herein, there are two main problems. One problem is how to electrically separate the N/P gates 802a/802b from each other. Another problem is how to connect the N/P gates 802a/802b independently and robustly to their respective gate contacts. These two issues must be solved with the minimum complexity to enable this functionality while reaching a reasonable and competitive process cost.

FIG. 9a is a top view layout of a CFET CMOS logic cell 900. FIG. 9b shows a cross section along A-A showing the final structure of the independent, isolated upper/lower (or N/P) gates 902a/902b with a separation layer 918 (e.g., a dielectric layer) disposed therebetween and their respective upper/lower gate contacts 908a/908b. Poly terminations (poly lateral cuts) 906 can also be seen. FIG. 9c is a cross section along B-B showing the shared, common gates 901 and the independent N/P gates 902a/902b as well as diffusion breaks 904 at the cell boundaries. Aspects of U.S. Ser. No. 16/848,638 cover this part describing a method to realize a final structure indicated in FIG. 9b. In the case of CFET, the final structure looks like a staircase, where the lower gate contact 908b can be etched from the metal levels above (like M0, not shown), following a conventional dual damascene method, to land on the lower gate 902b without interfering with the upper gate 902a.

Techniques disclosed herein describe how to achieve an inverted split gate, or inverted staircase for an inverted top tier FET, that is, an inverted 3D FETs on the top tier.

FIG. 10 shows a cross-sectional view of an example substrate segment, e.g., a multi-tier semiconductor structure 1000 according to some embodiments of the present disclosure. The semiconductor structure 1000 includes an inverted top-tier semiconductor structure of independent, isolated upper and lower gates (or gate regions) with their respective upper and lower gate contacts. The semiconductor structure 1000 can include a lower semiconductor device tier 1010. The lower semiconductor device tier 1010 can include a plurality of lower semiconductor devices. In an embodiment, the lower semiconductor devices are vertically stacked on one another. For example, the lower semiconductor device tier 1010 can include the lower FETs of the second semiconductor device tier 652 shown in FIGS. 6a and 6b. In an embodiment, the vertically stacked lower semiconductor devices can include lower gate-all-around (GAA) semiconductor devices with lower nanosheet channels, and the lower GAA semiconductor devices can include p-type field-effect transistors (FETs) or n-type FETs. In the example shown in FIG. 10, the lower semiconductor device tier 1010 can include a lower active layer 1011 and a lower gate region 1012.

The semiconductor structure 1000 can further include an upper semiconductor device tier 1020 disposed over the lower semiconductor device tier 1010. The upper semiconductor device tier 1020 can include a plurality of upper semiconductor devices. In an embodiment, the upper semiconductor devices are also vertically stacked on one another. For example, the upper semiconductor device tier 1020 can include the upper FETs of the second semiconductor device tier 652 shown in FIGS. 6a and 6b. In an embodiment, the vertically stacked upper semiconductor devices can include upper GAA semiconductor devices with upper nanosheet channels, and the upper GAA semiconductor devices can include p-type FETs or n-type FETs. In the example shown in FIG. 10, the upper semiconductor device tier 1020 can include an upper active layer 1021 and an upper gate region 1022.

In an embodiment, the semiconductor structure 1000 is a complementary FET (CFET), the lower semiconductor devices of the lower semiconductor device tier 1010 include n-type FETs, and the upper semiconductor devices of the upper semiconductor device tier 1020 include p-type FETs. In another embodiment, the semiconductor structure 1000 is another CFET, the lower semiconductor devices of the lower semiconductor device tier 1010 include p-type FETs, and the upper semiconductor devices of the upper semiconductor device tier 1020 include n-type FETs. In some other embodiments, both the lower semiconductor devices of the lower semiconductor device tier 1010 and the upper semiconductor devices of the upper semiconductor device tier 1020 include n-type FETs or p-type FETs.

The semiconductor structure 1000 can further include a separation layer 1018 (e.g., a dielectric layer) disposed between and separating the lower semiconductor device tier 1010 and the upper semiconductor device tier 1020, specifically, separating the lower gate region 1012 and the upper gate region 1022.

The semiconductor structure 1000 can further include a lower gate contact 1013. The lower gate contact 1013 extends downward from the lower gate region 1012 of the lower semiconductor device tier 1010. For example, the lower gate contact 1013 can include the lower gate contact 680 shown in FIGS. 6a and 6b. The semiconductor structure 1000 can further include an upper gate contact 1023. The upper gate contact 1023 extends downward from the upper gate region 1022 of the upper semiconductor device tier 1020 through the separation layer 1018. The upper gate contact 1023 is insulated from the lower semiconductor device tier 1010 and is independent from the lower gate contact 1013. Thus, independent connections can be established to the lower gate region 1012 and the upper gate region 1022.

FIG. 11 shows a cross-sectional view of an example substrate segment, e.g., a multi-tier semiconductor structure 1100 according to some embodiments of the present disclosure. The semiconductor structure 1100 can be fabricated in a sequential 3Di process. Compared with the semiconductor structure 1000 shown in FIG. 10, the semiconductor structure 1100 further includes a wiring tier 1060 disposed below the lower semiconductor device tier 1010. For example, the semiconductor structure 1100 can include the first wiring tier 661 shown in FIG. 6a. The semiconductor structure 1100 can further include an insulator layer 1090 disposed between the lower semiconductor device tier 1010 and the wiring tier 1060. For example, the insulator layer 1090 can include the insulator layer (or the SoI layer) 690 shown in FIG. 6a. In the exemplary embodiment, the lower gate contact 1013 and the upper gate contact 1023 extend downward to the wiring tier 1060 through the insulator layer 1090. In some embodiments, an oxide (AlO, for example) 1023b can be deposited as an isolator (or a dielectric layer) to electrically isolate the upper gate contact 1023 from the lower gate region 1012.

In an embodiment, the wiring tier 1060, like the first wiring tier 661 shown in FIG. 6a, can include one or more wiring layers (or wiring levels), with each wiring layer including one or more wiring tracks that extend in a direction along the front side 610a of the substrate 610. For example, the wiring tier 1060 can include a lower wiring track 1061 electrically connected to the lower gate contact 1013 and an upper wiring track 1062 electrically connected to the upper gate contact 1023. In an embodiment, the lower wiring track 1061 and the upper wiring track 1062 are independent from each other. Thus, the lower semiconductor device tier 1010 and the upper semiconductor device tier 1020 can be controlled independently.

FIGS. 12a to 12g illustrate an example method of fabricating a multi-tier semiconductor structure 1200 according to some embodiments of the present disclosure. The semiconductor structure 1200 can include the semiconductor structure 600, the semiconductor structure 1000 and/or the semiconductor structure 1100.

As shown in FIG. 12a, a bottom tier including a first wiring tier (e.g., the bottom tier 660 including the first wiring tier 661/1060) is provided, an insulator layer (or an SoI layer) (e.g., the insulator layer 690/1090) is formed over and bonded to the top of the first wiring tier 661, and an active stack of layers (or active layers) of a top tier (e.g., the second semiconductor device tier 652), including one or more channels (each of which may include one or more nanosheets) 1210 spaced apart from one another by an insulating layer 1220, is deposited and formed over the insulator layer 690. In some embodiments, lower and upper gate contacts are patterned and etched. For example, the active layers of the top tier 652 is patterned and etched to uncover the bottom tier 660, specifically the lower wiring track 1061 and the upper wiring track 1062 of the first wiring tier 661, to form lower and upper gate contact openings 1201 and 1202.

As shown in FIG. 12b, the lower and upper gate contact openings 1201 and 1202 can be filled with metal. For example, lower and upper liners (e.g., Ti or TiN liner) 1013a and 1023a (shown in FIG. 12d) can be deposited on lateral surfaces of the lower and upper gate contact openings 1201 and 1202, followed by deposition of Al, Cu, W, Ru, Co, or other conductive materials on the lower and upper liners 1013a and 1023a to form the lower and upper gate contacts 1013 and 1023 (CGB and CGT). Overburden of metal can be removed by chemical-mechanical polishing (CMP). A resist (etch mask) A can then be patterned and formed on the top tier 652, with the lower TiN liner 1013a and the metal filled in the lower gate contact opening 1201 uncovered while the upper TiN liner 1023a and the metal filled in the upper gate contact opening 1202 covered. A directional/anisotropic etch of the uncovered lower TiN liner 1013a and the metal filled in the lower gate contact opening 1201 is executed, such as with a plasma-based etch. The uncovered lower TiN liner 1013a and the metal are recessed a predetermined distance HD. This creates a height differential (i.e., the predetermined distance HD) between the lower gate contact 1013 and the upper gate contact 1023.

As shown in FIG. 12c, the resist (etch mask) A is stripped from the top tier 652 to uncover the upper gate contact 1023. Then a dry etch can be executed to partially etch both the lower gate contact 1013 and the upper gate contact 1023 a predetermined distance. Both the lower gate contact 1013 and the upper gate contact 1023 are etched at the same rate, and so after the dry etch is complete, there remains the predetermined distance (or a height differential) HD between the lower gate contact 1013 and the upper gate contact 1023. In the exemplary semiconductor structure 1200, the predetermined distance HD is determined such that the top of the lower gate contact 1013, after the dry etch is complete, is at a level within the lower semiconductor devices of the top tier 652.

As shown in FIG. 12d, the active layers of the top tier 652 is revealed or uncovered by etching the surrounding oxide. This can be done using a wet and dry etch. Oxide removal is conventionally known. This uncovers the lower and upper liners 1013a and 1023a of the lower and upper gate contacts 1013 and 1023, for example, TiN.

Figure 12G:
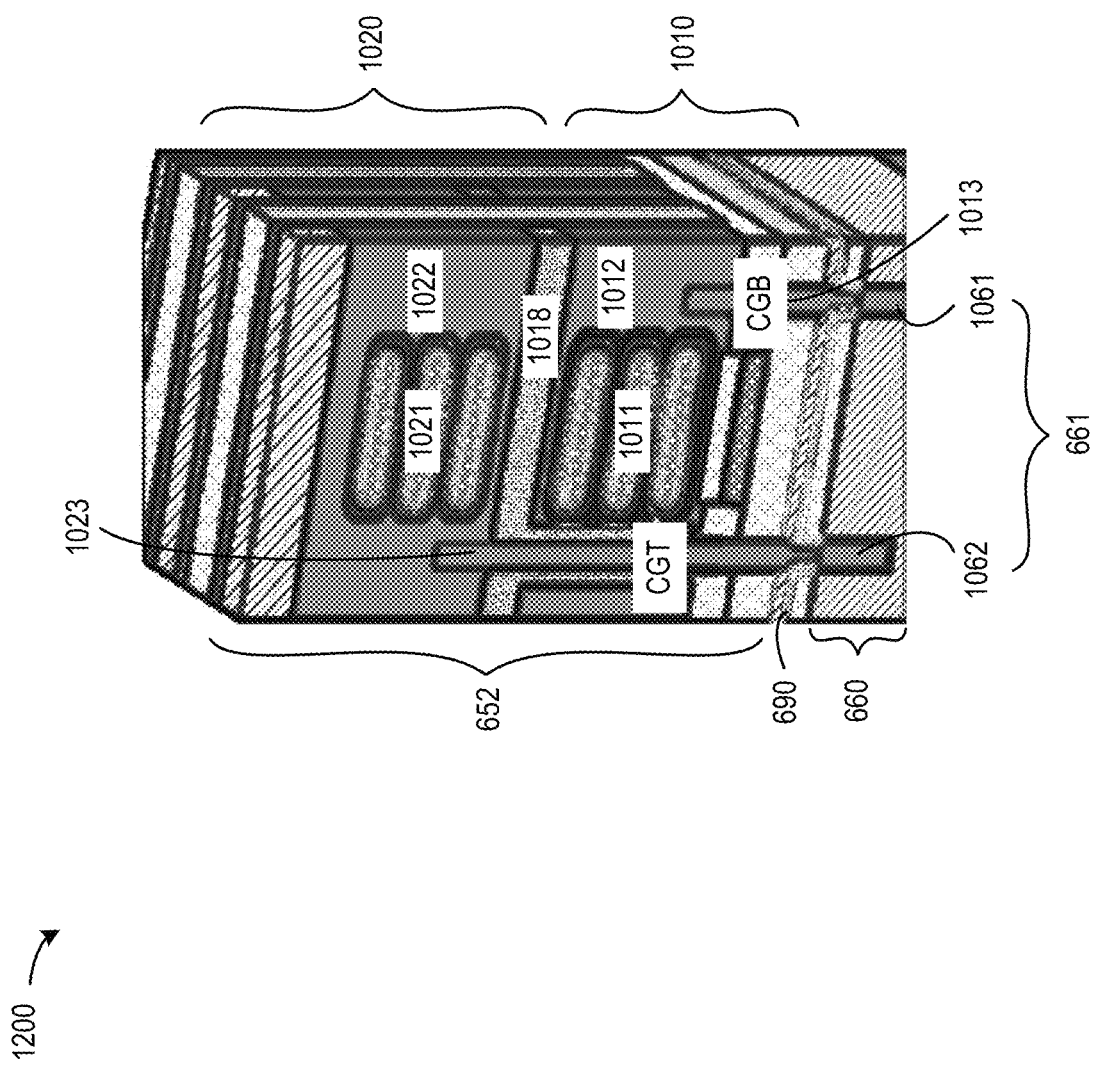

As shown in FIG. 12e, the uncovered lower and upper liners 1013a and 1023a can be etched to uncover the metal and then an oxide (AlO, for example) 1023b can be deposited selectively on the uncovered metal of the upper gate contact 1023 to electrically isolate the upper gate contact 1023 from the lower gate region 1012 (shown in FIG. 12g).

As shown in FIG. 12f, the process flow can then continue with conventional processing to the replacement metal gate (RMG) and gate all around (GAA) step to metalize the lower and upper gate regions 1012 and 1022 (shown in FIG. 12g) and to the deposition of the separation layer 1018, which separates the lower and upper gate regions 1012 and 1022.

As shown in FIG. 12g, the multi-tier semiconductor structure 1200 can be achieved after the RMG and GAA processes for CFET are completed. In the exemplary multi-tier semiconductor structure 1200, the top tier 652 is inverted and includes lower and upper semiconductor device tiers (FETs) 1010 and 1020, which is separated by the separation layer 1018. The upper FETs 1020 can be vertically stacked on the lower FETs 1010 and be p-type or n-type, and the lower FETs 1010 can be p-type or n-type. The lower and upper gate contacts 1013 and 1023 are independent from each other, and extend from the lower and upper gate regions 1012 and 1022, respectively, downward through the insulator layer 690, to the lower and upper wiring tracks 1061 and 1062 of the first semiconductor device tier 651, respectively. The upper gate contact 1023 is electrically isolated from the lower gate region 1012. In an embodiment, the lower wiring track 1061 and the upper wiring track 1062 are independent from each other.

FIGS. 13a to 13e illustrate another example method of fabricating another multi-tier semiconductor structure 1300 according to some embodiments of the present disclosure. The semiconductor structure 1300 can include the semiconductor structure 600, the semiconductor structure 1000 and/or the semiconductor structure 1100. The semiconductor structure 1300 shown in FIGS. 13a to 13e differs from the semiconductor structure 1200 shown in FIGS. 12a to 12g in that the lower gate region 1012 is surrounded by a dielectric block (e.g., oxide, nitride, etc.).

Figure 13C:
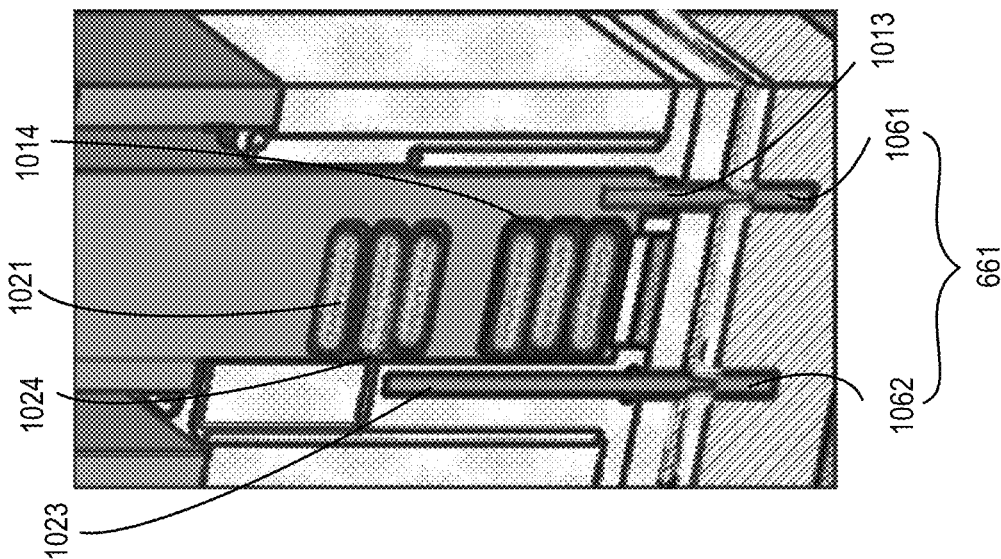
FIGS. 13a to 13e illustrate another example method of fabricating a multi-tier semiconductor structure according to some embodiments of the present disclosure.
Figure 13B:
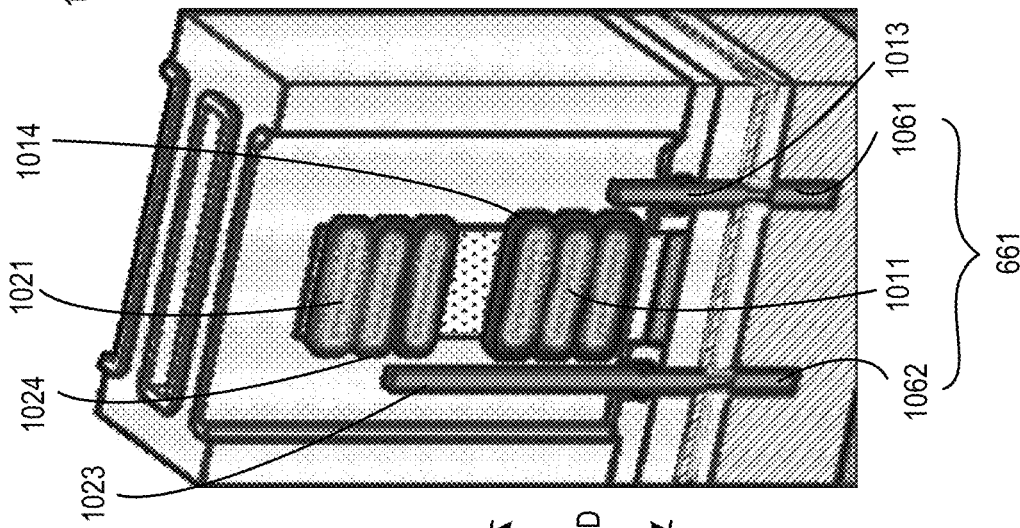
Figure 13A:
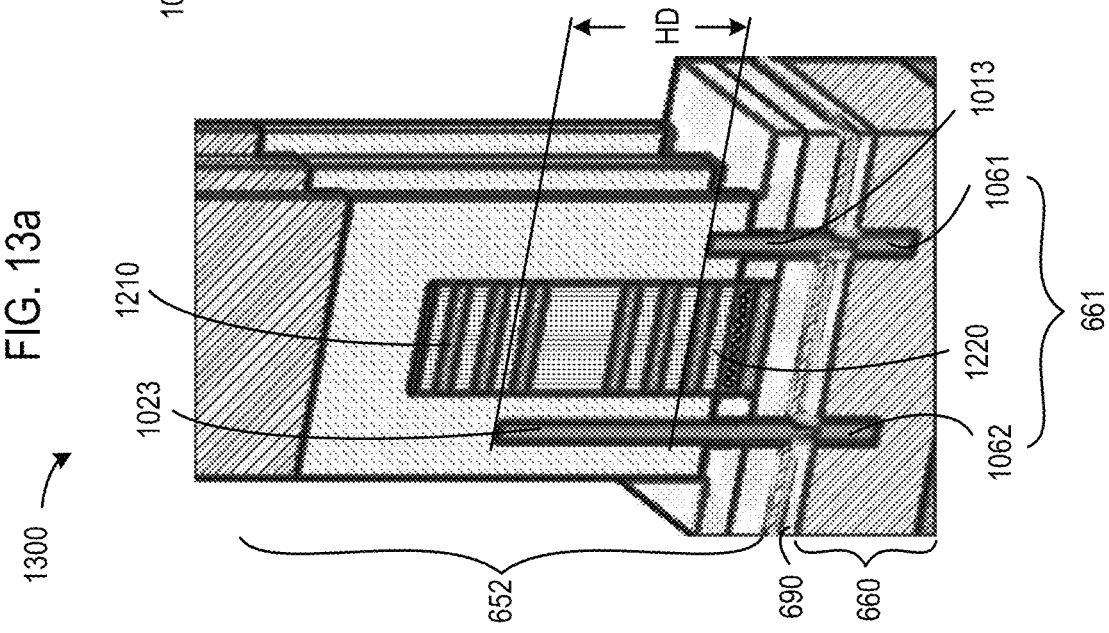

As shown in FIG. 13a, the bottom tier 660 including the first wiring tier 661/1060 is provided, the insulator layer 690/1090 is formed over and bonded to the top of the first wiring tier 661, and the active layers of the top tier 652 is deposited and formed over the insulator layer 690. In some embodiments, lower and upper gate contacts are patterned and PC patterning is executed to result in the lower and upper gate contacts 1013 and 1023 that have differential heights HD and extend from below the active layers of the top tier 652 through the insulator layer 690 to the lower and upper wiring tracks 1061 and 1062.

As shown in FIG. 13b, lower and upper work function metal 1014 and 1024, which are etched-tuned to set various threshold voltages, are formed surrounding the lower and upper active layers 1011 and 1021, respectively, in the RMG process. In the RMG process, source and drain structures (i.e., the active layers) of the top tier 652 are generally comprised of boron-doped SiGe for p-type FETs and phosphorous and/or arsenic doped silicon for n-type FETs. These source and drain structures are then capped with a given dielectric etch-stop layer (CESL) to protect the silicon epitaxy surface from oxidation as well as to provide an etch-stop layer to prevent damage to the source and drain structures. In the RMG process, a high-k dielectric film such as HfO or varieties of HfO coupled with dipole forming layers such as LaO and AlO, and a high-conductance metal can also be formed.

As shown in FIG. 13c, a resist (etch mask) B (not shown) is patterned and formed, which uncovers the upper gate contact 1023, and an etch process is executed to form an opening. The opening is then filled with deposition of a dielectric, and the dielectric is then recessed.

Figure 13E:
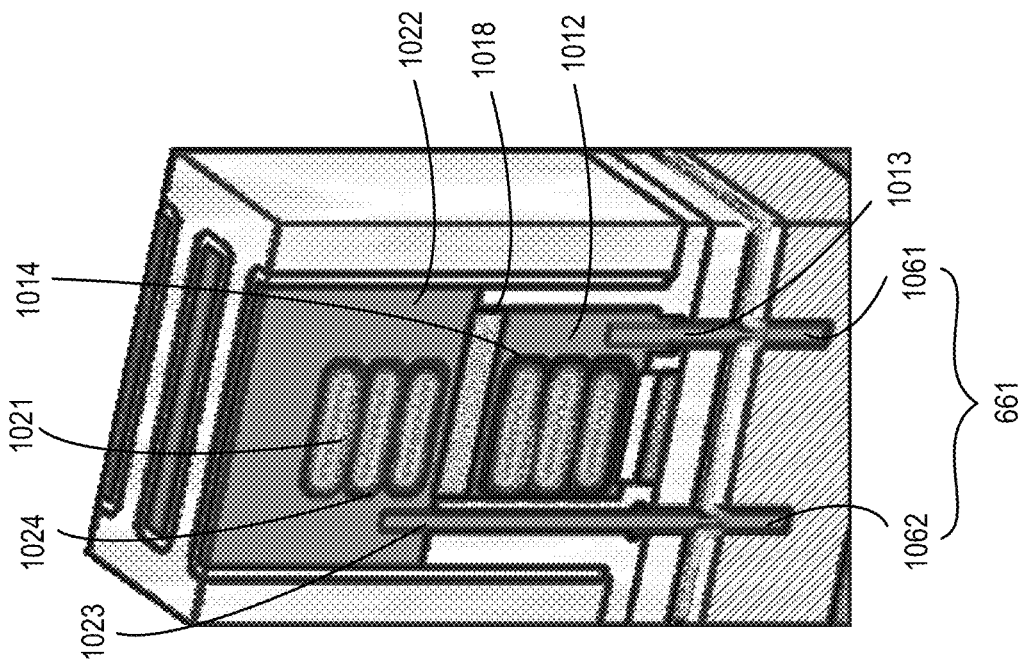
Figure 13D:
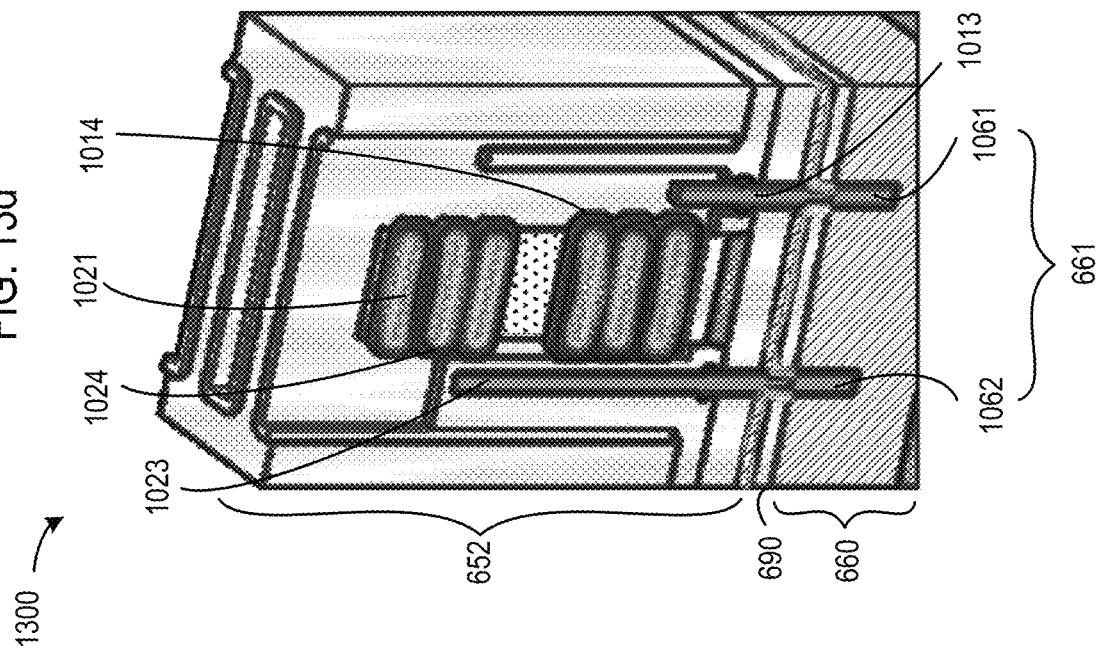

As shown in FIG. 13d, the resist (etch mask) B is stripped from the top tier 652. At this stage, the process flow can then continue with conventional processing to the replacement metal gate (RMG) and gate all around (GAA) step to metalize the lower and upper gate regions 1012 and 1022 (shown in FIG. 13e) and to the deposition of the separation layer 1018, which separates the lower and upper gate regions 1012 and 1022. For example, metal for the lower gate contact 1013 can be deposited, followed by selective deposition (AlO, for example) to cover the lower gate region 1012 and the lower gate contact 1013.

As shown in FIG. 13e, the multi-tier semiconductor structure 1300 can be achieved with metal on the upper gate region 1024 deposited.

Enabling independent lower and upper gates herein provides significant design and area scaling advantages. These techniques enable such a design feature in the challenging context of an inverted top-tier FET for multi-tier gate-on-gate 3D integration. In particular, each independent gate is connected to a metal layer located below the active devices thanks to the formation of gate contacts achieved by the techniques herein. As such, this disclosure significantly enhances CFET designs including those from U.S. Ser. No. 16/848,638. Note that description herein focused on CFET devices for convenience, but it can be appreciated that techniques herein can be applied to other 3D device architectures.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of embodiments of the disclosure are not intended to be limiting. Rather, any limitations to embodiments of the disclosure are presented in the following claims.

What is claimed is:

1. A multi-tier semiconductor structure, comprising:
   a lower semiconductor device tier that includes lower semiconductor devices;
   an upper semiconductor device tier disposed over the lower semiconductor device tier, the upper semiconductor device tier including upper semiconductor devices;
   a separation layer disposed between and separating the lower semiconductor device tier and the upper semiconductor device tier;
   a wiring tier disposed below the lower semiconductor device tier;
   a lower gate contact extending from a lower gate region of the lower semiconductor device tier downward to the wiring tier;
   an upper gate contact extending from an upper gate region of the upper semiconductor device tier downward through the separation layer to the wiring tier; and
   an insulator layer disposed between the lower semiconductor device tier and the wiring tier, the lower gate contact and the upper gate contact extending downward to the wiring tier through the insulator layer;
   an isolator formed to cover a lateral surface of the upper gate contact, the isolator electrically isolating the upper gate contact from the lower gate region,
   wherein the lower gate contact and the upper gate contact are independent from each other, and
   the isolator includes a different material from the insulator layer.

2. The multi-tier semiconductor structure of claim 1, wherein the wiring tier includes:
   a lower wiring track, to which the lower gate contact extends downward; and
   an upper wiring track, to which the upper gate contact extends downward,
   wherein the lower wiring track and the upper wiring track are independent from each other.

3. The multi-tier semiconductor structure of claim 1, wherein the lower semiconductor devices are vertically stacked on one another, and the upper semiconductor devices are vertically stacked on one another.

4. The multi-tier semiconductor structure of claim 3, wherein the lower semiconductor devices include lower GAA semiconductor devices with lower nanosheet channels, and the upper semiconductor devices include upper GAA semiconductor devices with upper nanosheet channels.

5. The multi-tier semiconductor structure of claim 4, wherein the lower GAA semiconductor devices include p-type FETs or n-type FETs, and the upper GAA semiconductor devices include p-type FETs or n-type FETs.

6. The multi-tier semiconductor structure of claim 1, wherein the isolator includes a dielectric layer.

7. The multi-tier semiconductor structure of claim 1, wherein the isolator includes a dielectric block.

8. The multi-tier semiconductor structure of claim 1, wherein the insulator layer includes a silicon on insulator (SoI) layer.

9. The multi-tier semiconductor structure of claim 1, wherein the insulator includes aluminum oxide (AlO).

* * * * *